Aug. 17, 1965 N. J. STEVENS 3,201,504

METHOD OF MOLDING A THERMOELECTRIC COUPLE

Filed Oct. 16, 1961

*INVENTOR.*
NORMAN JOHN STEVENS.

*BY* Raymond Curtin

ATTORNEY.

United States Patent Office 3,201,504
Patented Aug. 17, 1965

3,201,504
METHOD OF MOLDING A THERMO-ELECTRIC COUPLE

Norman John Stevens, Syracuse, N.Y., assignor to Carrier Corporation, Syracuse, N.Y., a corporation of Delaware
Filed Oct. 16, 1961, Ser. No. 145,088
2 Claims. (Cl. 264—104)

This invention relates broadly to thermoelectric structures. More particularly, this invention relates to a thermoelectric element of the type employed to form thermoelectric couples which in turn are arranged to form a thermoelectric array for the purpose of either providing a heat pump or electric current generator.

Thermoelectric elements are employed in accordance with the experiments of Peltier to provide either heating or cooling in response to the passage of an electric current through the junction of the elements which are formed of certain dissimilar materials. The same phenomenon is utilized for the purpose of providing electrical current generation by supplying a heating medium to one junction of the dissimilar materials while supplying a cooling medium to the other junction. This latter effect is more commonly known as the Seebeck effect.

It has been determined that certain materials may be combined for the purpose of forming either a P-type element while other combinations may be combined to provide an N-type element. It is the junctions between the P-type and N-type elements that are the junctions referred to above. During the fabrication of the thermoelectric elements a specific chemical element commonly called a doping agent, is added and the identity of the doping agent determines the formation of either a P-type or N-type thermoelectric element. As pointed out above, an electric current may be generated within a circuit including one or more P-type thermoelectric elements and one or more N-type thermoelectric elements. Once a relatively high temperature or hot medium is placed in heat transfer relation with the hot junction of the elements, while at the same time, a relatively low temperature or cold medium is placed in connection with the opposite junction of the elements, an electric current of predetermined characteristic is provided. One of the major problems involved in successfully fabricating a construction which includes a plurality of P-type and N-type elements for the generation of an electric current is the development and maintenance of a good physical joint between the connecting strap surface forming the hot junction between the P-type and N-type elements. It is conventional to connect the ends of adjacent P-type and N-type elements in spaced relation with a conducting strap or bridge member which serves as the junction between the thermoelectric elements. The bridge element must be formed of a material compatible with the passage of electric current as well as a good conductor of heat.

In a thermoelectric generator of the kind under consideration a source of heat on the order of 600° C. which is supplied in heat transfer relation with the bridge, tends to cause the material which bonds the thermoelectric element to the bridge, to diffuse into the thermoelectric element resulting in a breakdown of the phenomenon causing the generation of the electric current.

In order to overcome the effects of such a diffusion mechanical elements such as springs have been employed for the purpose of assuring good physical contact between the thermoelectric elements, the conducting strap and the heat producing instrumentality without the use of other bonding agent. Such an arrangement, it will be appreciated, involves an expensive construction prone to mechanical failure.

The primary object of this invention is the provision of an improved thermoelectric element of the kind under consideration wherein an assembly of thermoelectric elements to form a thermoelectric couple or module may be obtained without the use of mechanical elements such as springs in order to achieve the intimate physical contact between the couples and other structural elements necessary at the hot junction of the thermoelectric couples.

An additional object of the invention is the provision of an improved thermoelectric element wherein a body formed of thermoelectric material is united with a material having characteristics suitable as a bridge element without the necessity of mechanical devices but may use a bonding material without fear of diffusion of the bonding material into the thermoelectric element.

An additional object of the invention is the provision of a novel method of making a thermoelectric element wherein the element includes a body portion of thermoelectric material formed with a cap or terminal portion of a material suitable for use as a conducting strap or bridge element between two thermoelectric elements.

A still further object of the invention is the provision of a novel thermoelectric element encapsulated within a sleeve or jacket of a material for the purpose of permitting operation at a higher temperature level as well as minimizing the effects of oxidation.

An additional object of the invention involves the provision of a novel method of forming a thermoelectric couple including two thermoelectric elements connected by a conducting strap in which the thermoelectric elements are formed from material in particle form compressed to provide a unitary body having the desired thermoelectric characteristics.

In attaining the objects of the invention there is provided a novel thermoelectric element including a body portion formed of thermoelectric material in granular or powdered form compacted to unite with a terminal member which may be either imperforate or formed of particles of a material having suitable characteristics as a conducting strap.

These and other objects of the invention will be apparent upon consideration of the specification and drawing in which.

Figure 2:
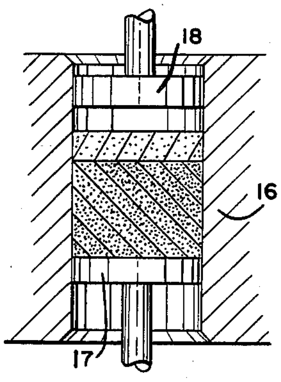
FIGURE 2 is a diagrammatic representation of a step employed in the novel method of forming the thermoelectric element illustrated in FIGURE 1.
Figure 1:
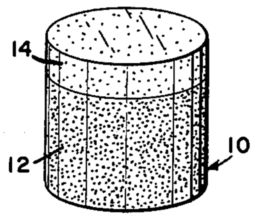
FIGURE 1 is a perspective view of a novel thermoelectric element forming the subject of this invention.

Referring more particularly to the drawings, there is shown in FIGURE 1, a thermoelectric element 10 including a body portion 12 and a terminal or cap portion 14. The thermoelectric element 10 is formed by depositing a charge of thermoelectric material 12 in granular or powdered form in the cavity of a die member 16. A second charge of powdered material such as iron having the diffusion resisting characteristics described and which conducts electricity and heat is introduced into the cavity and the resulting mixture of particles assumes the stratified or laminar orientation illustrated in FIGURE 2. The press members 17 and 18 are actuated to compress the charge of powdered material in the die member into the unitary self-sustaining body or structure illustrated in FIGURE 1.

In the formation of the thermoelectric element illustrated in FIGURE 1, the material chosen to serve as the body of the element may be lead telluride containing a doping agent such as sodium which forms a thermoelectric element classified as a P-type element. A corresponding N-type thermoelectric element may be formed in the same manner, the only difference being in the character of the thermoelectric material forming the body of the element. In the latter case, the lead telluride may have lead iodide admixed to serve as the doping agent.

It has been determined that when thermoelectric material of the physical composition set forth below has been subjected to compressing forces on the order of 60,000 p.s.i., more or less, a rigid structural part which possesses strength sufficient when later sintered, to resist destruction due to ordinary forces accompanying the handling of the element or assembly including the element, is provided.

In preparing the thermoelectric material for supply in powdered or granular form to the die member it has been found that a grinding operation sufficient to reduce the material to a powder-like appearance will provide material that may be successfully formed into a thermoelectric element when subjected to pressure set forth above.

Figure 3:
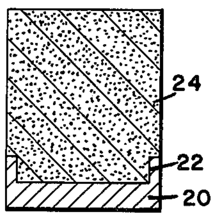
FIGURE 3 is a view in section showing another form of thermoelectric element constructed in accordance with the invention.

FIGURE 3 illustrates another form of the invention wherein a solid imperforate base member 20 formed of iron is provided with a cavity 22. In this form of the invention, not shown, a mold is positioned to surround the cavity 20 and a charge of thermoelectric material 24 in particle form, is deposited therein. Subsequent compression of the material within the form and sintering will provide a self-sustaining structural part having a thermoelectric characteristic determined by the compositions of the powder or granular material deposited in the mold. The physical union between the base member and thermoelectric body portions is such that no other material or instrument is needed to prevent separation of the parts.

Figures 4, 5, 6:
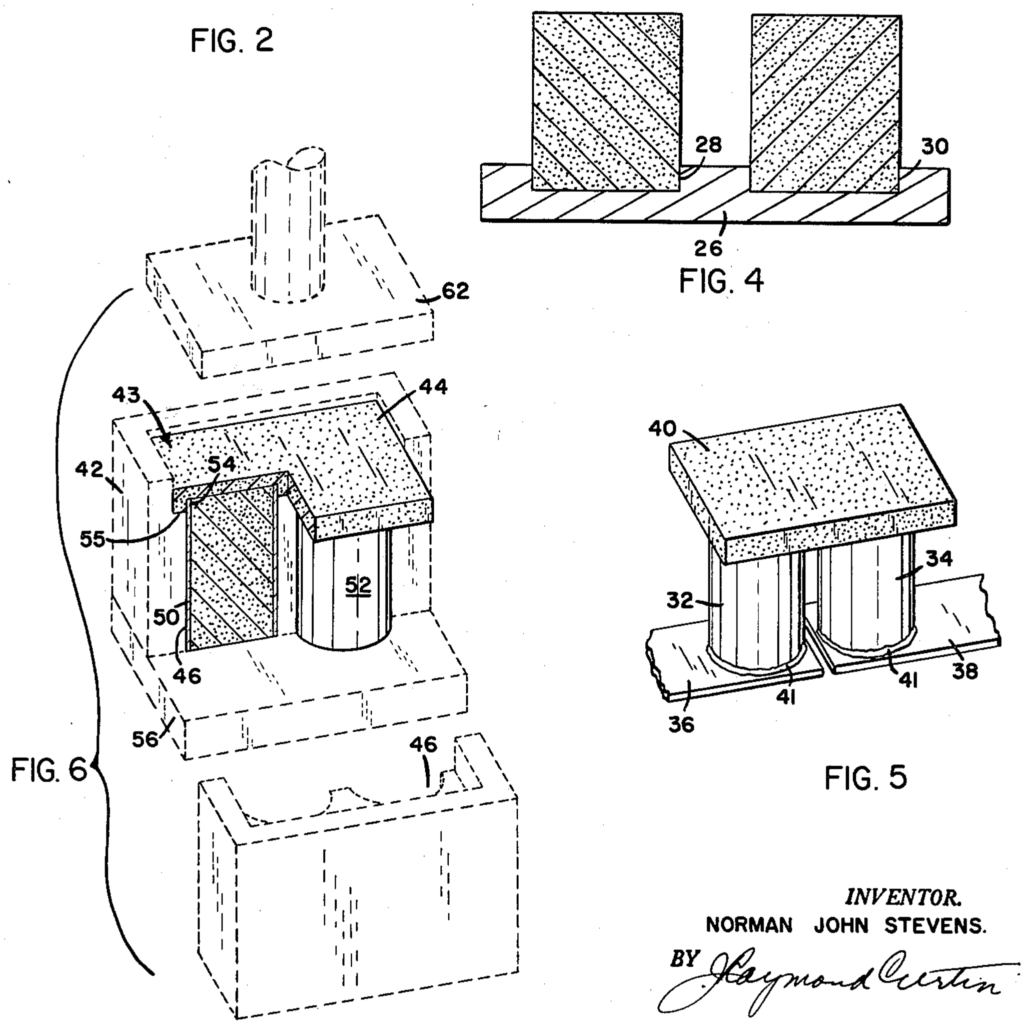
FIGURE 4 is an additional modification of the invention illustrating a thermoelectric couple formed in accordance with the invention.
FIGURE 5 is a perspective view of a still further modification of the invention illustrating a thermoelectric couple having thermoelectric elements provided with a jacket of dielectric material.
FIGURE 6 is an exploded view illustrating the manner of manufacture of the portion of the assembly illustrated in FIGURE 5.

An additional form of the invention is shown in FIGURE 4 wherein a thermoelectric couple is, in part, illustrated. The base member 26 may be an imperforate member having cavities 28 and 30 formed therein so that the P-type and N-type thermoelectric elements are united therewith in the manner described in connection with the form of the invention shown in FIGURE 3.

Referring to FIGURE 5 there is illustrated a thermoelectric couple wherein there is provided P-type thermoelectric element 32 and an N-type thermoelectric element 34 having conducting strap or bridge member 40 connecting the top portion of each and serving as a junction for the elements 32, 34. In the form of invention illustrated, a ceramic sleeve engages the outer surface of the thermoelectric elements and serves as an electrical insulator and encapsulator. Elements 36 and 38 form conducting straps serving as a connection between the cold junctions of adjoining elements. The ceramic material is secured to the conducting straps 36 and 38 with, for instance, an epoxy resin 41.

Referring more particularly to FIGURE 6, there is shown a two-piece die 42 forming when assembled, a cavity 43 having a portion 44, 46, for the reception of ceramic sleeves 50 and 52. The parts are so arranged and dimensioned that the ceramic sleeve includes a portion 54 projecting above shoulder 55 formed at the juncture of portion 44, 46 in the die member 42. A charge of thermoelectric material, in particle form, of a type employed to form a P-type element is introduced into one of the sleeves and a charge of thermoelectric material, in powdered form, of the type for fabricating an N-type element is deposited in the other sleeve member. It will be obvious that base member 56 maintains the thermoelectric material within the confines determined by the ceramic sleeve. As before, the thermoelectric material has been fabricated in particle form and is confined in the manner described. In addition, a charge of powder material such as iron is deposited in the remaining portion of the cavity of the die member. The entire charge of powder material is compressed by the action of press member 62, resulting in formation of thermoelectric couples wherein the thermoelectric elements are encapsulated within the sleeve formed of a non-conducting or dielectric material. The bridge element connecting the two thermoelectric elements is formed of a material such as iron which is compatible with the materials of which the thermoelectric elements are formed.

While I have described a preferred embodiment of my invention it will be understood the invention is not limited thereto but may be embodied within the scope of the following claims.

I claim:

1. The method of making a thermocouple which consists in the steps of arranging at least a pair of spaced sleeve members formed of a dielectric material in side-by-side relation within a pressing die; supplying the first sleeve member with a quantity of material, in particle form, having preselected thermoelectric characteristics; supplying the second sleeve member with a quantity of material, in particle form, having thermoelectric characteristics opposite that initially supplied to the first sleeve member; introducing over one end of adjoining sleeve members a confined charge of granular material, in particle form, substantially free of thermoelectric characteristics; and applying to the assembly a compressive force sufficient to provide a self-sustaining rigid unitary structure including two thermoelectric bodies connected by a bridge portion serving as a thermal junction.

2. The method of making a thermoelectric couple including a first thermoelectric element having properties classifying it as a P-type element, a second thermoelectric element having properties classifying it as an N-type element and a connecting member serving as a junction between the two elements which consists in the steps of inserting first and second sleeves of a dielectric material in side-by-side relation into a die member having a cavity including a portion of which accommodates a substantial portion of the sleeves; depositing within the first sleeve a quantity of material in particle form, having the characteristics of one of the desired thermoelectric elements; depositing within the other sleeve a quantity of material, in particle form, having the characteristics of the other of the desired thermoelectric elements; filling the remainder of the cavity with a quantity of material, in particle form, suspectible of serving as a connecting member or junction in the thermoelectric couple; and compressing the deposited material to a predetermined density sufficient to form a unitary self-sustaining thermoelectric couple.

References Cited by the Examiner

UNITED STATES PATENTS

| | | | |
|---|---|---|---|
| 1,848,655 | 3/32 | Petrik | 136—4.2 |
| 2,289,152 | 7/42 | Telkes | 136—5 |
| 2,997,514 | 8/61 | Roeder | 136—4.2 |

OTHER REFERENCES

Horne et al.: RCA Technical Note, No. 304, November 1959, 1 page.

Horne, RCA Technical Note, No. 305, November 1959, 1 page.

WINSTON A. DOUGLAS, *Primary Examiner.*

JOSEPH REBOLD, *Examiner.*